(12) United States Patent
Val

(10) Patent No.: US 6,809,367 B2
(45) Date of Patent: Oct. 26, 2004

(54) DEVICE FOR INTERCONNECTING, IN THREE DIMENSIONS, ELECTRONIC COMPONENTS

(75) Inventor: Christian Val, St Remy les Chevreuse (FR)

(73) Assignee: 3D Plus, Buc (FR)

( * ) Notice: Subject to any disclaimer, the term of this patent is extended or adjusted under 35 U.S.C. 154(b) by 0 days.

(21) Appl. No.: 10/149,789

(22) PCT Filed: Dec. 12, 2000

(86) PCT No.: PCT/FR00/03486

§ 371 (c)(1),
(2), (4) Date: Jun. 17, 2002

(87) PCT Pub. No.: WO01/45172

PCT Pub. Date: Jun. 21, 2001

(65) Prior Publication Data

US 2002/0191380 A1 Dec. 19, 2002

(30) Foreign Application Priority Data

Dec. 15, 1999 (FR) ............................................. 99 15838

(51) Int. Cl.⁷ ............................................. H01L 27/108
(52) U.S. Cl. ......................... 257/301; 257/303; 257/306
(58) Field of Search ................................. 257/301, 303, 257/306; 438/243, 253, 387, 396

(56) References Cited

U.S. PATENT DOCUMENTS

| | | | |
|---|---|---|---|
| 4,408,256 A | 10/1983 | Val | |
| 4,413,170 A | 11/1983 | Val et al. | |
| 4,518,818 A | 5/1985 | Le Ny et al. | |
| 4,546,028 A | 10/1985 | Val et al. | |
| 5,323,533 A | 6/1994 | Val | |
| 5,400,218 A | 3/1995 | Val | |
| 5,461,545 A | 10/1995 | Leroy et al. | |
| 5,526,230 A | 6/1996 | Val | |
| 5,637,536 A | 6/1997 | Val | |
| 5,640,760 A | 6/1997 | Val et al. | |
| 5,847,448 A | 12/1998 | Val et al. | |
| 5,885,850 A | 3/1999 | Val | |
| 6,307,261 B1 | 10/2001 | Val et al. | |
| 2002/0192902 A1 * | 12/2002 | Kimura et al. ............... 438/253 |

FOREIGN PATENT DOCUMENTS

| | | |
|---|---|---|
| EP | 0 490 739 | 6/1992 |
| EP | 0 593 330 | 4/1994 |
| EP | 0 638 933 | 2/1995 |
| FR | 2 539 386 | 12/1983 |
| FR | 2 645 681 | 10/1990 |
| FR | 2 726 941 | 5/1996 |
| WO | 95 25341 | 9/1995 |

OTHER PUBLICATIONS

P. Singer: "Making the Move to Dual Damascene Processing" Semiconductor International, US, Newton, MAS, IL, vol. 20, No. 9, Aug. 1997, pp. 79–80, 82.

S.F. Al–Sarawi et al.: "a review of 3–d packaging technology" IEEE Transactions on Components, Packaging and Manufacturing Technology, Part B: Advanced Packaging., vol. 21, No. 1, Feb. 1998, pp. 2–14.

* cited by examiner

*Primary Examiner*—Dung A. Le
(74) *Attorney, Agent, or Firm*—Oblon, Spivak, McClelland, Maier & Neustadt, P.C.

(57) ABSTRACT

The invention relates to a device for interconnecting, in three dimensions, electronic components. In order to decrease the parasitic capacitances between the connections and shielding of the device, metallized grooves are cut in the block of stacked circuits, just clipping the connection to conductors of which are set back from the corresponding face of the block. The assembly is then encapsulated with resin and shielded by metallization. The invention is especially applicable to producing electronic systems in three dimensions with a small size.

6 Claims, 7 Drawing Sheets

DETAIL A

DEVICE FOR INTERCONNECTING, IN THREE DIMENSIONS, ELECTRONIC COMPONENTS

The invention relates to a method for interconnecting, in three dimensions, packages or circuits containing at least one electronic component.

The production of present electronic systems must take into account increasing requirements for compactness, because of the increasing number of circuits used, and for fast operation. With the aim of compactness, the production of stacks of integrated circuit chips, as described in French patent FR 2 670 323, or of packages encapsulating semiconducting chips, as described in French patent FR 2 688 630 has already been proposed, the wafers or packages being interconnected in three dimensions by using the faces of the stack as interconnection surfaces.

However, since these blocks of stacked packages or circuits are then generally encapsulated with an electrically insulating material then shielded by depositing a metallization layer, there are not inconsiderable parasitic capacitances between the connections traced on the surfaces of the stack and the shielding. This is a significant drawback, especially when seeking fast operation of the components.

The object of the present invention is to overcome this drawback by interconnecting the conductors of the packages or circuits no longer by connections traced on the surfaces of the block but by connections making use of grooves perpendicular to the face of the block.

According to the invention, a method of interconnecting, in three dimensions, packages or circuits containing at least one electronic component and fitted with connection conductors is provided, in which said packages or circuits are stacked and secured by encapsulation using an electrically insulating material in order to form a block, said method being characterized in that it comprises the following steps:

a) cutting the block while leaving the ends of the conductors set back from the corresponding faces of the block;

b) cutting grooves into said faces and perpendicularly thereto, which grooves just clip the end of said conductors, respectively;

c) metallizing the block and its grooves;

d) polishing said faces of the block in order to remove the metallization from these faces;

e) encapsulating the entire block with an electrically insulating material.

The invention also provides an electronic device for interconnection in three dimensions comprising packages or circuits containing at least one electronic component and fitted with connection conductors, in which said packages or circuits are stacked and encapsulated with an electrically insulating material in order to form a block, characterized in that the ends of said conductors are set back from the corresponding faces of the block, in that said faces comprise grooves which just clip the respective ends of said conductors and the faces of which are metallized and in that said block comprises an electrically insulating material encapsulating the entire block and grooves.

Using these arrangements, only the cross sections of the metallizations of the grooves are flush with the surface of the block facing the shielding metallization, hence a considerable decrease in the parasitic capacitances. Furthermore, the fact that all the inner lateral surfaces of the grooves are metallized and contribute to the conduction markedly increases the cross section of the connections and therefore the possibilities of routing large currents without also increasing the separation of the connections.

Another aspect of the invention consists in taking advantage of the grooves thus obtained in order to produce supply busbars with a distributed capacitor thereby forming, by cutting the bottom of a groove, two mutually facing electrodes for the ground-supply system.

According to this other aspect of the invention, a method of the above type is therefore provided, characterized in that, during step b), at least one predetermined groove of said grooves just clips the end of two adjacent conductors supplying said packages or circuits and in that said method further comprises, between steps c) and e), the insertion of a step of:

g) cutting, in the bottom of said predetermined grooves and over their entire length, second grooves.

The invention also provides a device of the above type, characterized in that predetermined grooves just clip the ends of two adjacent conductors and in that the metallization of the bottom of said predetermined grooves is interrupted over the entire length of said grooves.

Thus it is possible to obtain modules with an integrated or hybrid busbar of small size and at low cost.

The invention will be better understood and other features and advantages will become apparent using the description below and the appended drawings where:

FIG. 1 shows a partial view of a known device with interconnections in three dimensions according to patent FR 2 688 630, FIG. 2, a detail A of FIG. 1 and FIG. 3, a section along B—B of FIG. 2.

This known device is formed by stacking packages or circuits 2 fitted with connection conductors 21 and securing by encapsulation using an electrically insulating material so as to form a block 3. This material is preferably chosen so that it is thermomechanically matched to the material forming the package or the circuit so as to facilitate heat dissipation and to avoid possible constraints or failures due to differences in the values of the expansion coefficients of the materials which are too great. It is possible to use, for example, a curable resin such as an epoxy resin.

Figure 1:
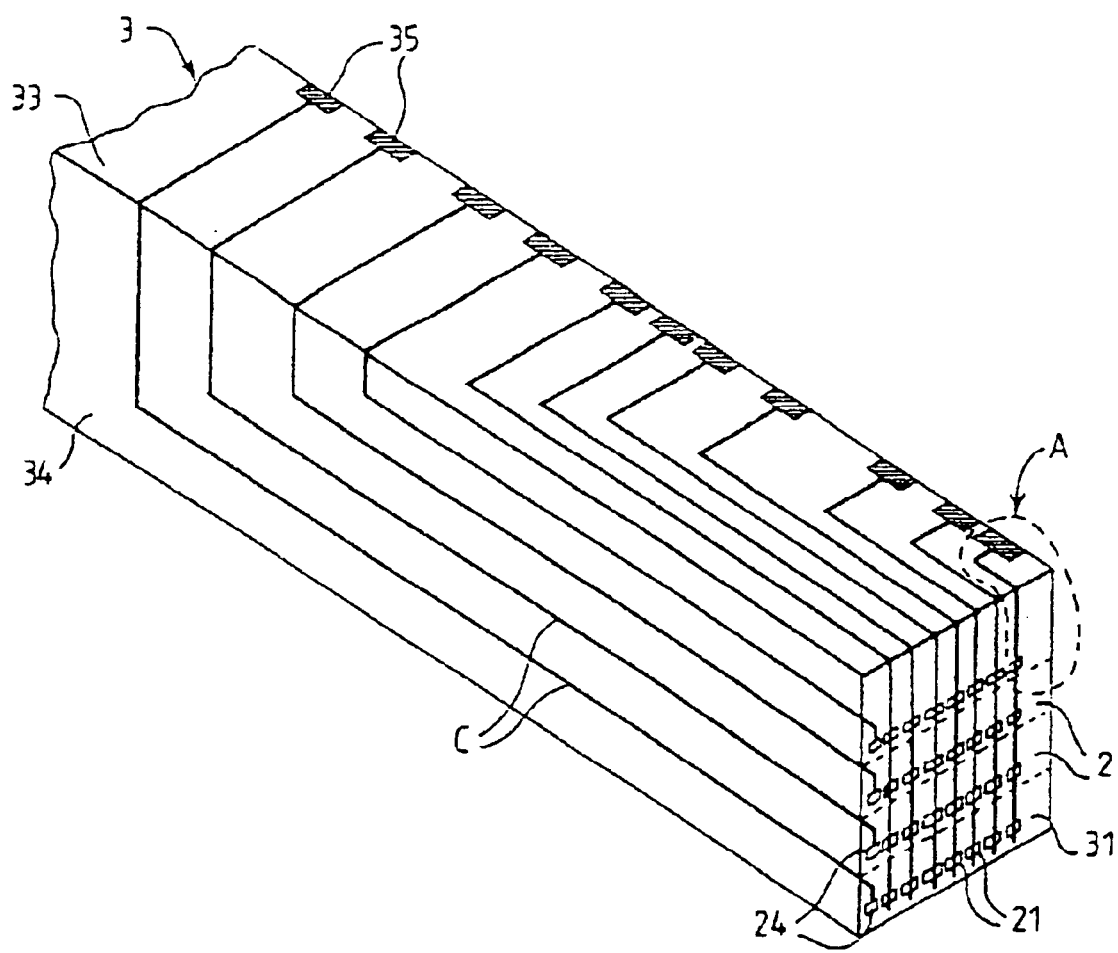
FIGS. 1 to 3 show a device with interconnection in three dimensions of a known type.

The block is cut and polished in order to form faces 31, 33, 34 such that the conductors connecting the packages are flush with the corresponding faces of the block (face 31 in FIG. 1). Next, all the faces of the block are metallized then the connections C are cut, for example by laser etching.

Figure 2:
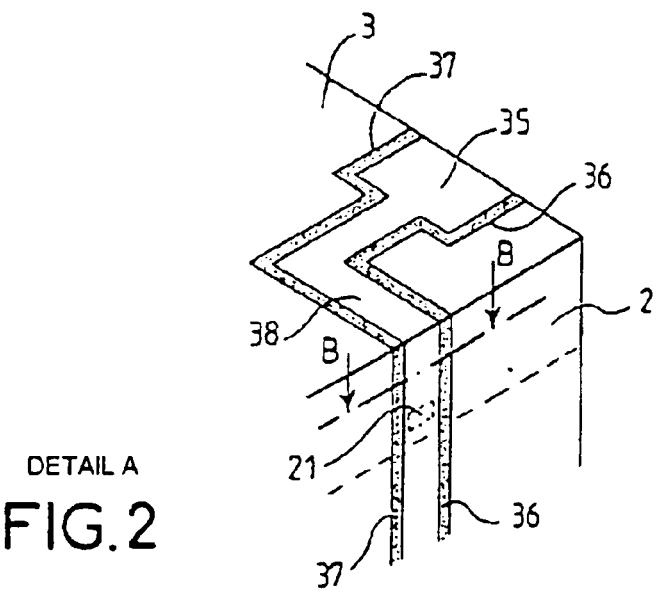

FIG. 2 shows the detail A of FIG. 1. A connection 38 between the appropriate conductors 21 of the various packages can be seen therein, this connection ending at a pad 35 for electrical connection to external circuits.

The connection 38 and the pad 35 are obtained by etching 36, 37, for example using a laser, locally destroying the conducting metallization layer M.

Figure 3:
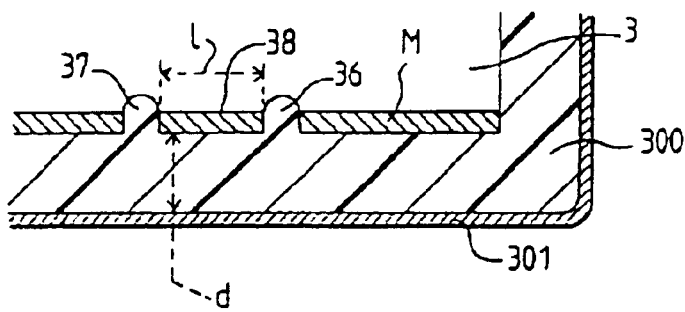

The section along B—B of FIG. 3 illustrates the finished device.

The block 3 with the metallization M, the etched grooves 36 and 37 and the connection 38 of width l is encapsulated in an electrically insulating material 300 over a thickness d and a shielding metallization 301 is deposited over the assembly.

It should be noted that, since the thickness d is small, a not inconsiderable parasitic capacitance appears between the connection 38 and the metallization 301. This capacitance is of the form:

$$C = \varepsilon_v \varepsilon_0 \frac{A}{d}$$

where A is the area of the facing surfaces, $\epsilon_0 = 8.86 \times 10^{-12}$ F/m and $\epsilon_v$ is the permittivity of the material 300 encapsulating the block (for example, about 4).

For example, if one assumes a connection width l of 350 $\mu$m and a thickness d of 100 $\mu$m, for a unit connection length, 1 mm, this gives:

$$C = 12.4 \times 10^{-14} F$$

which is about 0.125 pF per mm.

For a connection length 38 of 10 mm, a parasitic capacitance of 1.25 pF is already obtained, which could constitute a considerable drawback for circuits operating increasingly fast with small supply voltages.

The solution according to the invention consists in considerably reducing the facing surfaces of the connections and of the shielding, which considerably reduces the parasitic capacitances.

Figure 4:
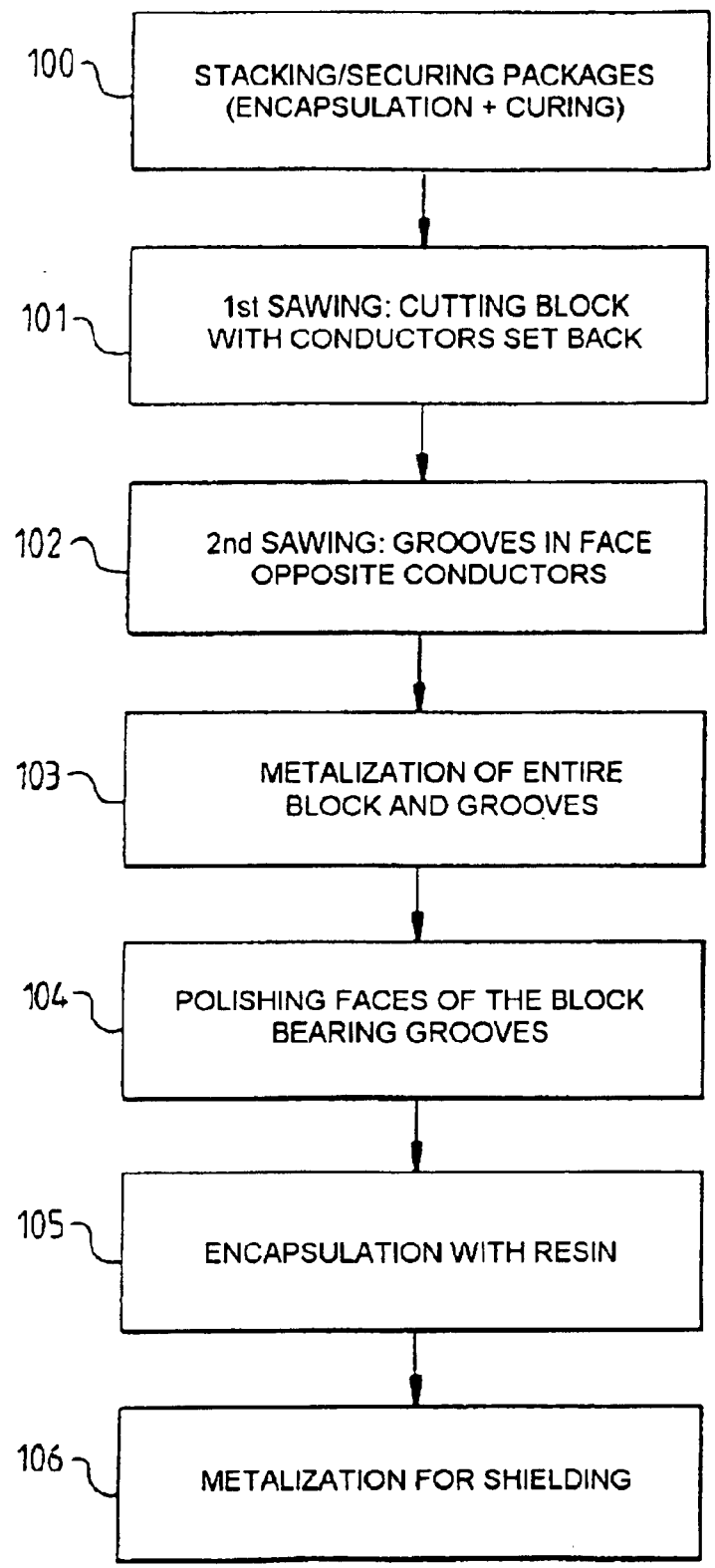
FIG. 4 shows a flow diagram of one embodiment of the method according to the invention.

FIG. 4 therefore illustrates one embodiment of the method according to the invention.

The first step of the method, 100, does not change with respect to the prior art. The packages or circuits are stacked and they are secured by encapsulating the assembly using an electrically insulating material, such as a resin which is cured.

Figure 5:
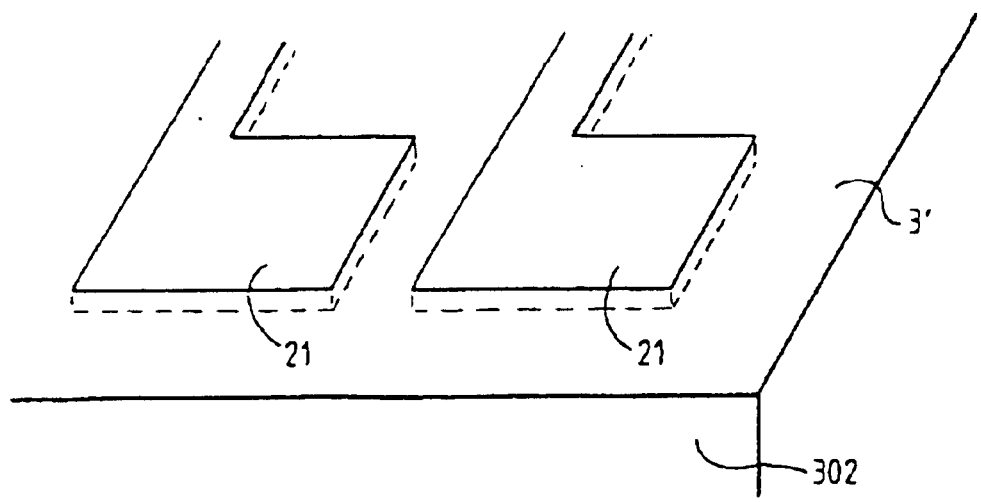
FIG. 5 shows a step of fabricating the device according to the invention.

The following step 101 consists in cutting the secured stack such that the conductors 21 connecting the packages or circuits are set back from the corresponding face of the block. This is shown in FIG. 5. The block 3' obtained after step 101 is seen therein with the ends of the conductors 21 of the upper package. The cutting plane, for example cut by sawing, is physically embodied by the face 302 of the block 3'.

The conductors 21 may be set back from the face 302 by a few micrometers to a few hundred micrometers.

The following step 102 consists in producing grooves perpendicular to the face 302 and to the plane of the packages over a depth which is enough to clip the end of the set-back conductors 21. A section which could be metallized is thus obtained.

The following step 103 consists in depositing one (or more) conducting layer(s), for example made of metal, over all the faces of the block 3' and the previously made grooves.

The following step 104 consists in polishing the faces of the block comprising the grooves in order to remove the short circuit from the connections produced in the grooves.

The following step 105 consists in encapsulating the assembly in an electrically insulating material such as a curable resin. Finally, the step 106 comprises metallizing the encapsulated assembly in order to produce a shielding.

Figure 6:
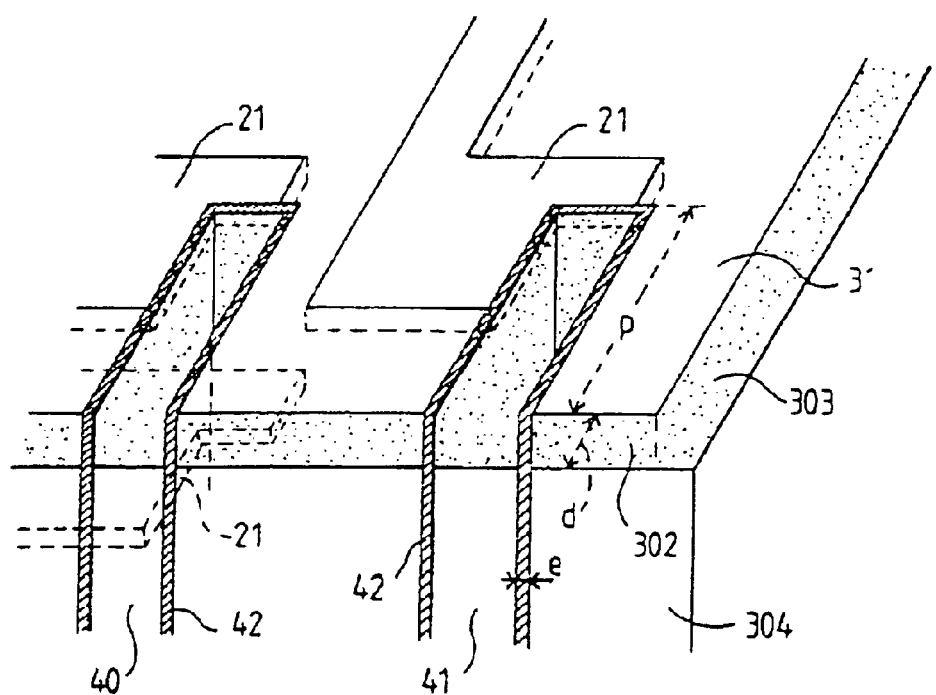
FIG. 6 is a partial view of one embodiment of the device according to the invention.

FIG. 6 partially shows the finished device according to the invention. The conductors 21 and the face 302 of the block 3' of FIG. 5 can be found therein. Grooves 40, 41 are cut into the face 302 up to the conductors 21. The metallization of the grooves 42 is that which remains after the step 104 of polishing the face 302, which removes the metallization from this face. The remaining metallization 42 provides the connection between the corresponding conductors of the various packages. The block 3' is encapsulated with a resin 303 after the step 105, and the resin is covered with a shielding metallization 304.

The grooves can be produced in step 102 by sawing, milling, laser etching or any other known technique.

As can be seen in FIG. 6, the parasitic capacitances are now virtually exclusively those existing between the metallization sections 42 flush with the face 302 and the shielding 304. They are of the form:

$$C = 2\varepsilon_v \varepsilon_0 \frac{A'}{d}$$

The area A' is equal to e per millimeter of connection.

If one assumes a thickness e of 7 $\mu$m, a capacitance of about 0.005 pF/mm is then obtained, that is to say 0.05 pF for a connection length of 10 mm. It may thus be noted that the parasitic capacitance has been divided by 25.

Figure 7A:
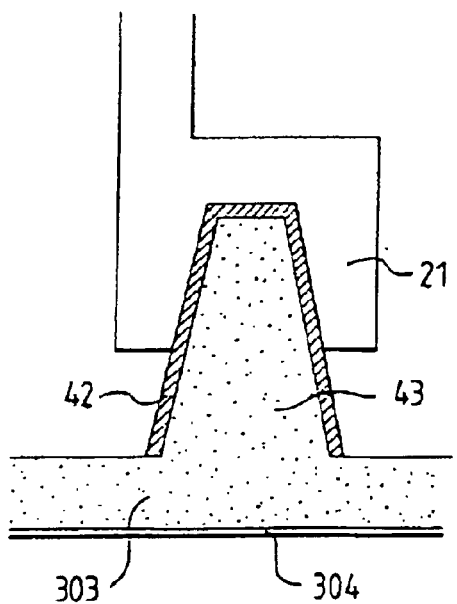
FIGS. 7A and 7B show a detail of variants of the device according to the invention.
Figure 7B:
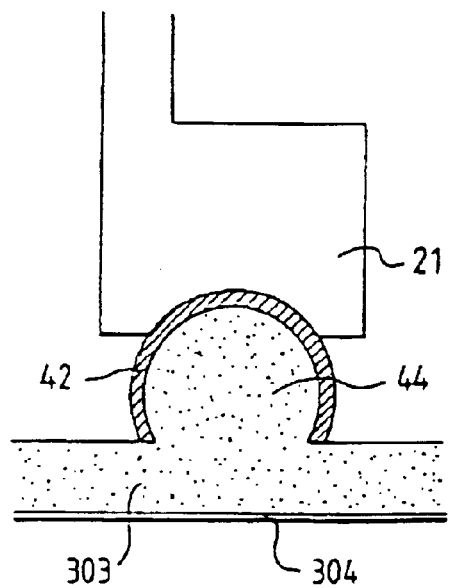

FIGS. 7A and 7B show other shapes of grooves obtained depending on the cutting technique used. In FIG. 7A, the cross section of the grooves 43 is trapezoidal and, in FIG. 7B, the cross section of the grooves 44 is partly circular.

According to another aspect of the invention, it is possible to consider improving this method in order to produce supply busbars with a distributed integrated or hybrid capacitor.

Figure 8:
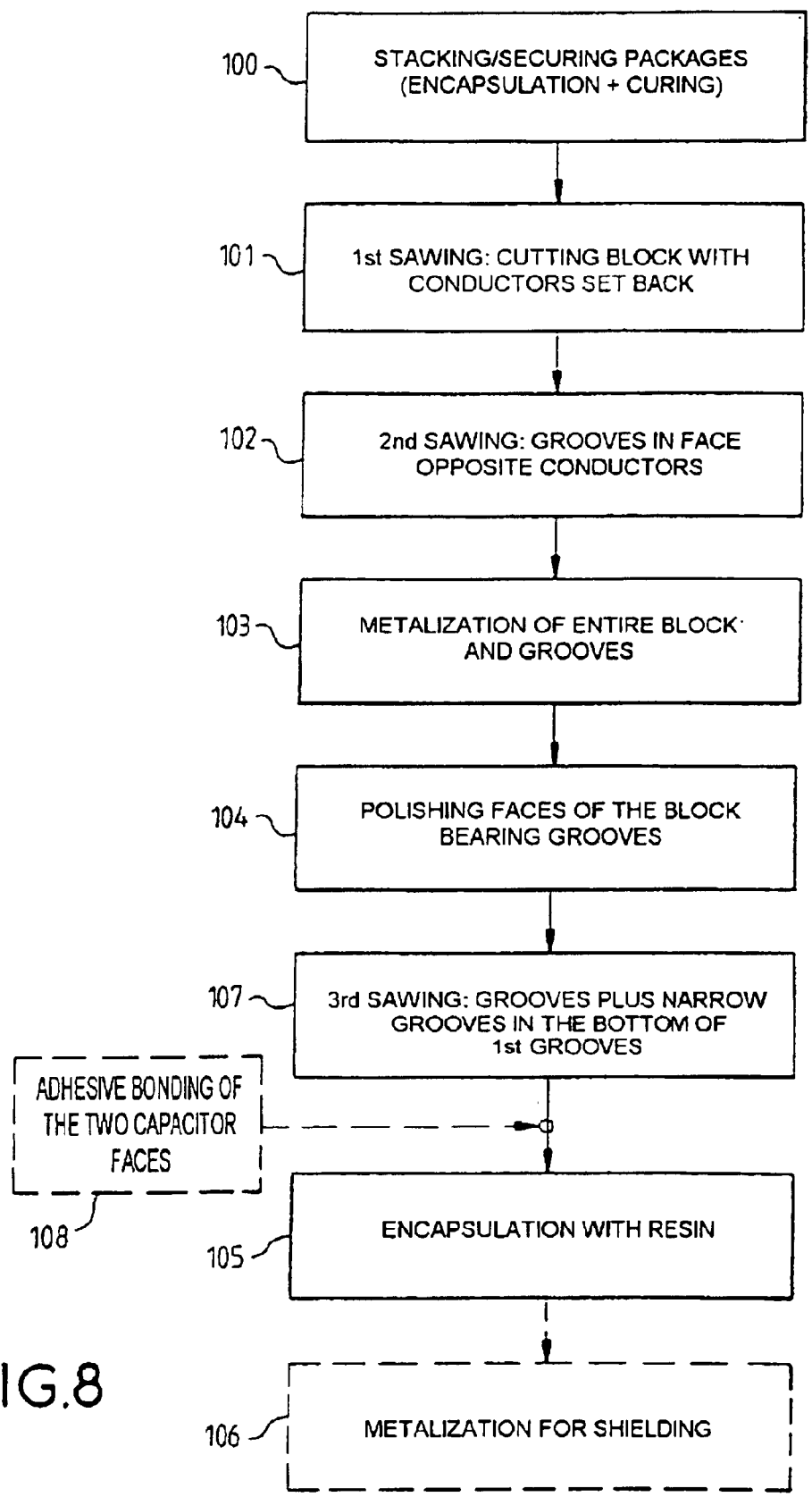
FIG. 8 shows a flow diagram of another embodiment of the method according to the invention.

FIG. 8 illustrates this variant of the method according to the invention. Compared with the method of FIG. 4, first of all, for predetermined grooves having to form said bars, provision was made that step 102 of cutting grooves would have to allow two adjacent conductors supplying said packages to be clipped. On the other hand, provision was made to insert, between step 103 and step 105, a step 107 of cutting, along the bottom of these predetermined grooves and over their entire length, second grooves in order thus to separate two ground and supply electrodes.

Figure 9:
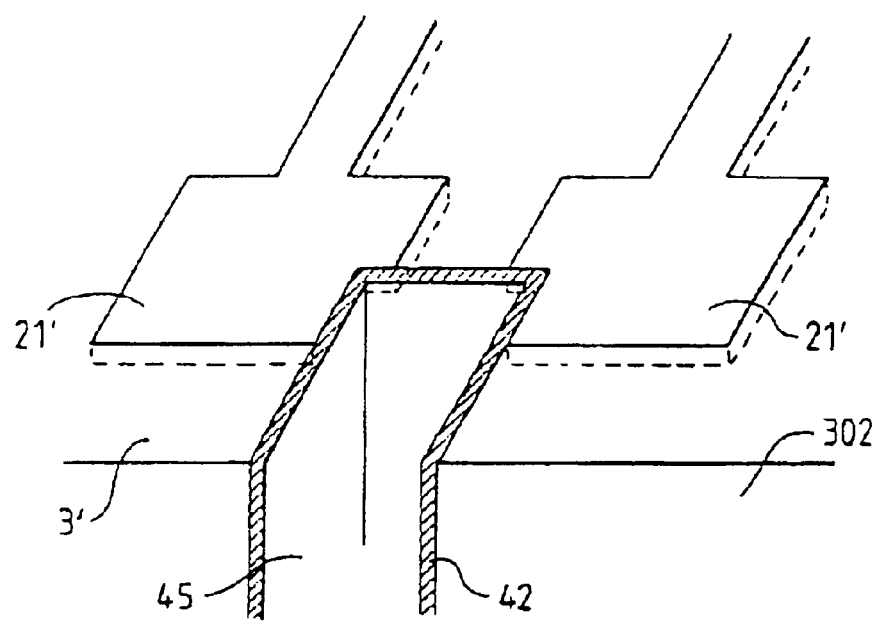
FIG. 9 illustrates a step of fabricating a device according to the method of FIG. 8.

FIG. 9 is a partial view of the device after step 104. The groove 45 just clips two adjacent conductors 21' of the block 3' and its faces have a metallization 42 flush with the polished face 302.

Figure 10:
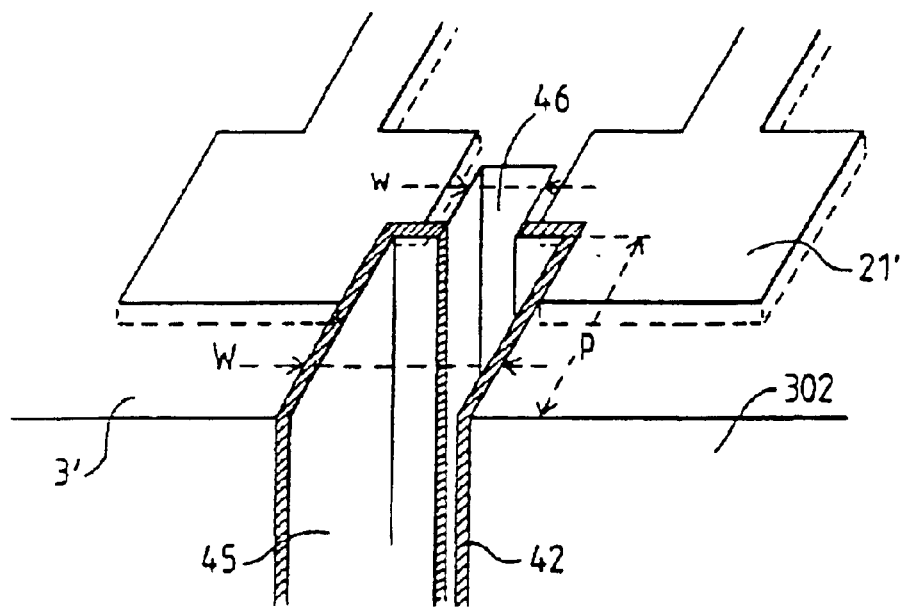
FIG. 10 is a partial view of the device according to the invention, obtained according to this variant of the method.

FIG. 10 shows a partial view after step 107.

The second groove 46 of width w less than the width W of the groove 45 has cut the metallization 42 in order to form two mutually facing electrodes.

Step 105 (FIG. 8) then consists in encapsulating the entire block 3'-grooves 45, 46 using an electrically insulating material such as a curable organic resin. The aim of this is first of all to enclose the grooves to prevent dust or flux residues during brazing from contaminating the conductors, connections and electrodes. This then makes it possible to redeposit a metal coating as a shielding for the entire module according to optional step 106, if shielding is needed.

Finally, this makes it possible to obtain a capacitance distributed along the two electrodes. Usually, an epoxy resin highly filled with mineral particles is used in order to reduce its expansion coefficient. A permittivity of about 4 is obtained. Under these conditions, with a groove depth p of 1 mm and a width W of 200 μm, a capacitance of about 0.177 pF/mm is obtained. With a groove of length 10 mm, a capacitance of about 1.77 pF is obtained.

However, for some applications, it is possible to use a resin filled with dielectric particles, for example barium titanate, in order to reach much higher permittivities (typically a few hundred). Thus, with a permittivity $\epsilon_r$=400, a capacitance of about 177 pF would be obtained.

Figure 11:
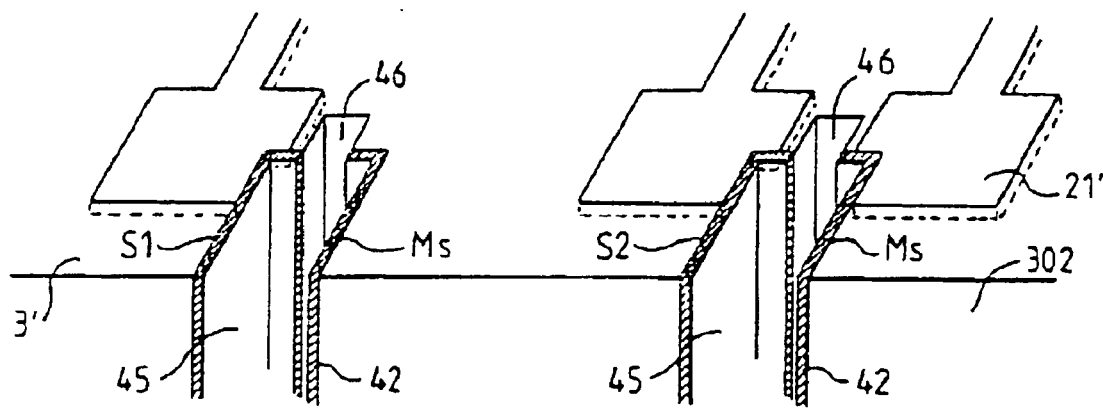
FIG. 11 shows the device according to the invention, obtained according to this variant of the method in another application.

The production of two mutually facing electrodes in a groove 45, as shown in FIG. 10, apart from the application indicated above to produce the ground and supply electrodes, may lead to other applications and, in particular, that illustrated in FIG. 11.

This is because, at high frequencies, between two neighboring signal connections, there may be crosstalk, that is to say the induction of a parasitic current from one connection onto the adjacent connection. With connections made in coplanar form (without grooves), the crosstalk can be reduced by separating the connections by means of a ground connection (which is also coplanar). However, this means having to markedly increase the pitch of the signal connections.

The device according to the invention enables this drawback to be advantageously overcome, as can be seen in FIG. 11. It can be seen therein that, in each groove 45, one of the electrodes, Ms, can be connected to ground, such that the signal electrodes S1, S2 are separated from each other by a shielding or a ground plane Ms. The electrodes Ms may be connected to conductors 21', as to the right of FIG. 11, or else act solely as shielding while being connected to ground without being connected to conductors 21', as to the left of FIG. 11.

Figure 12:
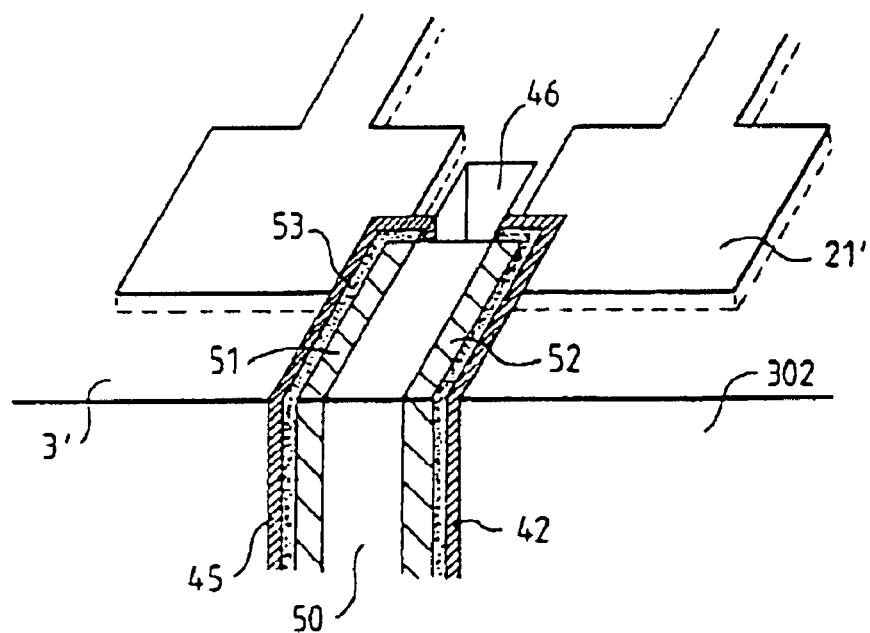
FIG. 12 is a view of a variant of the device of FIG. 10.

Another possibility offered by the device of FIG. 10 is the production of a supply busbar with a hybrid capacitor, as shown in FIG. 12. In this embodiment, a capacitor 50, comprising metallizations forming electrodes 51, 52 on two opposing longitudinal faces, is inserted into the groove 45. These faces are placed opposite metallizations 42 forming the two electrodes of the connection and the corresponding electrodes are connected to them, while fastening the capacitor, using an electrically conducting material, for example by adhesive bonding with an adhesive 53 filled with silver. This provides a saving in size and a device protected against short circuits and contamination by virtue of encapsulating the assembly. Furthermore, this makes it possible to minimize the self-inductances for the supply of the various stacked stages of the block, since each stage is directly connected to the capacitor 10, and for the supply of all the stages to be optimally balanced. The insertion of the capacitor is represented by step 108 in FIG. 8.

Mention may be made that the order of the steps 104 and 107 is interchangeable in the diagram of the method of FIG. 8. However, the order indicated in this figure is preferred since this prevents conducting dust resulting from the operation 104 becoming lodged in the second grooves 46.

Of course, the exemplary embodiments described in no way limit the invention; in particular, connections to be produced on the other faces of the block than those where the connection conductors 21, 21' can be found may also be produced on the same principle of cutting grooves in order to limit the parasitic capacitances.

What is claimed is:

1. An electronic device for interconnection in three dimensions comprising:
    packages or circuits containing at least one electronic component and fitted with connection conductors, in which said packages or circuits are stacked and encapsulated with an electrically insulating material to form a block having substantially planar surfaces, opposing faces of the block coming in contact with opposite ends of said conductors,
    wherein the opposite ends of said conductors are set back from said opposing faces of the block,
    wherein said faces comprise grooves having enough depth to just clip respective ends of said conductors and the faces of which are metallized, and
    wherein said block comprises an electrically insulating material encapsulating all of the block and grooves.

2. The device as claimed in claim 1, wherein said block further comprises a metallic shielding layer covering the electrically insulating material encapsulating an assembly of the block and conductors.

3. The device as claimed in claim 1, wherein at least one predetermined of the grooves just clip ends of two adjacent conductors, and wherein the metallization of a bottom of said at least one predetermined groove is interrupted over an entire length of said grooves.

4. The device as claimed in claim 3, wherein, between lateral faces of said at least one predetermined groove, a capacitor is fastened to the lateral faces by an electrically conducting material.

5. The device as claimed in claim 1, wherein a cross section of said grooves is one of trapezoidal, and partly circular.

6. The device as claimed in claim 1, wherein said grooves are first grooves having a width W and bottom surfaces, and said device further comprises second grooves disposed in said bottom surfaces and having a width smaller than W.

* * * * *

UNITED STATES PATENT AND TRADEMARK OFFICE
CERTIFICATE OF CORRECTION

PATENT NO.     : 6,809,367 B2
DATED          : June 17, 2002
INVENTOR(S)    : Christian Val It is certified that error appears in the above-identified patent and that said Letters Patent is hereby corrected as shown below:

Title page,
Item [54], Title, should read -- DEVICE FOR INTERCONNECTING, IN THREE DIMENSIONS, ELECTRONIC COMPONENTS --.

Signed and Sealed this

Fourteenth Day of December, 2004

JON W. DUDAS
*Director of the United States Patent and Trademark Office*